(12) United States Patent
Lu et al.

(10) Patent No.: US 8,384,180 B2
(45) Date of Patent: Feb. 26, 2013

(54) GATED CO-PLANAR POLY-SILICON THIN FILM DIODE

(75) Inventors: JengPing Lu, Fremont, CA (US); Raj B. Apte, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/358,171

(22) Filed: Jan. 22, 2009

(65) Prior Publication Data

US 2010/0181573 A1 Jul. 22, 2010

(51) Int. Cl.
*H01L 31/075* (2006.01)
*H01L 31/105* (2006.01)
*H01L 31/117* (2006.01)

(52) U.S. Cl. .................. 257/458; 257/656; 257/E29.336

(58) Field of Classification Search .................. 257/458, 257/656, 697, E29.336
See application file for complete search history.

(56) References Cited

U.S. PATENT DOCUMENTS

| 5,616,944 A * | 4/1997 | Mizutani et al. ............. 257/365 |
| 2006/0017139 A1* | 1/2006 | Eguchi et al. .................. 257/656 |
| 2008/0185596 A1* | 8/2008 | Tseng et al. .................... 257/84 |

\* cited by examiner

*Primary Examiner* — Hoai V Pham
(74) *Attorney, Agent, or Firm* — Marger Johnson & McCollom PC

(57) ABSTRACT

A diode has a first contact of a material having a first conductivity type, a second contact of a material having a second conductivity type arranged co-planarly with the first contact, a channel arranged co-planarly between the first and second contacts, a gate arranged adjacent the channel, and a voltage source electrically connected to the gate. A diode has a layer of material arranged on a substrate, a first region of material doped to have a first conductivity type, a second region of material doped to have a second conductivity type, a channel between the first and second regions formed of an undoped region, a gate arranged adjacent the channel, and a voltage source electrically connected to the gate. A method includes forming a layer of material on a substrate, forming a first region of a first conductivity in the material, forming a second region of a second conductivity in the material, arranged so as to provide a channel region between the first and second regions, the channel region remaining undoped, depositing a layer of gate dielectric on the layer of material, arranging a gate adjacent the channel region on the gate dielectric, and electrically connecting a voltage source to the gate.

9 Claims, 6 Drawing Sheets

GATED CO-PLANAR POLY-SILICON THIN FILM DIODE

BACKGROUND

Diodes have many uses in many different types of electronic circuits. In many implementations, diodes consist of multiple layers of semiconductor material. Separate deposition steps form these multiple layers in a process that is not compatible with thin film transistor (TFT) processes. These diodes also have relatively high junction capacitance compared to the design rules for TFT processes. The relative thickness of these devices renders them unusable and incompatible with thin-film transistor (TFT) processes and devices.

An alternative configuration employs a lateral, or co-planar, configuration. In this configuration, an n-type material forms one of the source/drain contacts and a p-type material forms the other source/drain contact. They are separated by a co-planar channel region generally formed from an intrinsic or undoped semiconductor, typically referred to as an i-channel or i-region. The arrangement of materials forms a P-I-N (PIN) diode. These devices have much higher compatibility with TFT processes and would generally be useful in TFT circuits. U.S. Pat. No. 7,064,418 provides an example of these types of devices.

Issues arise with these types of PIN diodes. They generally are not compatible with certain materials, such as amorphous silicon. High-speed circuits that have fast turn on, low parasitic capacitance and low reverse bias leakage current requirements cannot generally use these types of devices because of their unsatisfactory performance in these areas.

DETAILED DESCRIPTION OF THE EMBODIMENTS

Figure 1:
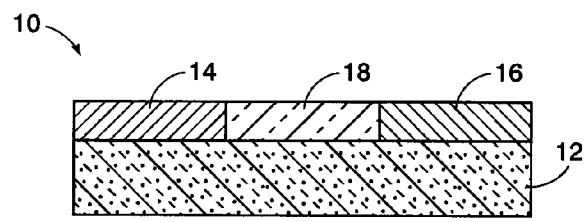
FIG. 1 shows an example of a current PIN diode.

FIG. 1 shows a current implementation of a thin film PIN diode 10. In the case, the PIN diode consists of poly-silicon (poly-Si), but other materials may be used as well, including amorphous silicon. The PIN diode resides on a substrate 12, upon which there is a p-type semiconductor region 14 and an n-type semiconductor region 16. An 'i' region separates the p-type and n-type regions. The i-region generally consists of the intrinsic semiconductor, the material that is semiconductor as n-type and p-type region without doping. The regions forming the PIN diode typically have a thickness in the range of 500 Angstroms. Generally, a thin film device is one manufactured from one or more thin films of material. A thin film has a thickness that may range from fractions of a nanometer to several micrometers.

Figure 2:
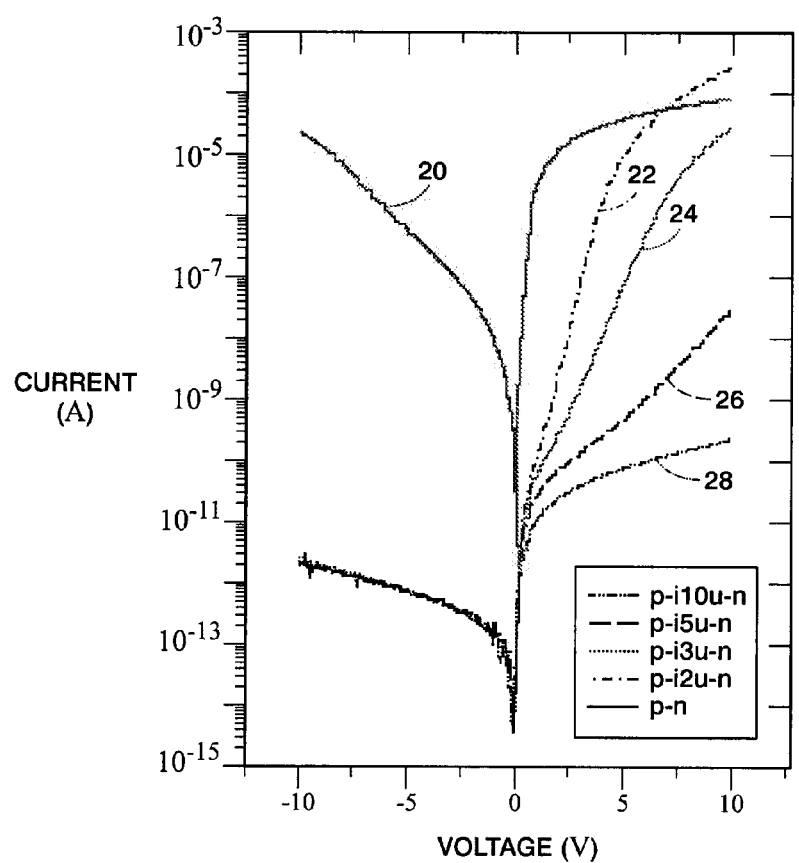
FIG. 2 shows a current-voltage curve for PIN diodes having varying lengths of un-doped semiconductor region.

FIG. 2 shows a current-voltage graph for current implementations of PIN voltages based upon the length of the i-region. Curve 20 represents a p-n junction. Curve 22 represents a PIN diode having an i-region of 2 micrometers, curve 24 represents a 3 micrometer i-region, curve 26 represents a 5 micrometer i-region and curve 28 represents a 10 micrometer i-region.

As can be seen, the diodes having an i-region larger than 5 micrometers, curves 26 and 28, have a slow turn-on characteristic. These curves remain flatter than desirable as they move towards the right side of the graph. For the other three curves, 20, 22 and 24, these diodes have unacceptably high reverse bias leakage current.

In circuit component analysis, the 'ideality factor' consists of constant adjustment factor used to correct discrepancies between an ideal p-n junction and a measured device. I $$\propto \left( \exp\left(\frac{q_0 V}{nKT}\right) - 1 \right)$$

where I is the diode current, V is the bias voltage, q0 is the unit charge, KT is the Boltzmann constant and temperature, and n is the ideality factor. The diodes shown in FIG. 1, except p-n diode of curve 20, have very high ideality factors. Generally, an ideality factor in the range of 1 to 2 indicates an efficient PIN diode.

Figure 3:
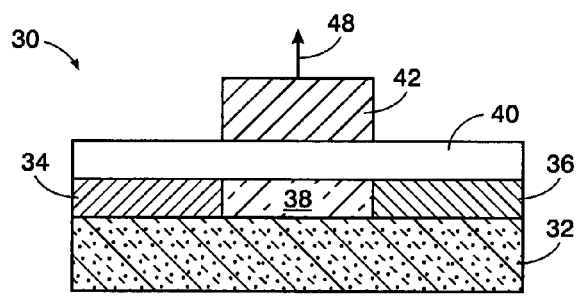
FIG. 3 shows an embodiment of a gated, co-planar PIN diode.

Standard TFT processes may result in a PIN diode with an ideality factor in the range of 1.67 using a biased gate. FIG. 3 shows an embodiment of such a diode, 30. The diode is a PIN diode somewhat similar to the diode of FIG. 1. The diode is formed on a substrate 32 and has regions of different conductivity types, such as a p-type region 34 and an n-type region separated by an i-region 38. Significant differences exist between the structure of this diode and the diode of FIG. 1. These differences include a much thinner material layer, such as poly-Si, from which the diode is formed.

Returning to FIG. 3, a layer of gate dielectric 40 at least partially covers the diode layer. While not shown in FIG. 1, the diode pictured there would have had a similar dielectric. The gate 42, typically made of metal, resides on the gate dielectric generally arranged adjacent the i-region. Another significant different in the diode of FIG. 3 lies in the electrical connection between the gate 42 and a fixed potential voltage 48, which may also be referred to a voltage source.

The voltage source may operate either positively or negatively, depending upon the design and the application. This voltage allows biasing of the undoped region 38. Applying a positive bias induces electrons in the channel making this region more 'n-type.' Negative bias induces holes in the undoped region making this region more 'p-type.' This diode may allow for variations in performance depending upon the voltage levels applied, in addition to the polarity. Providing electronic control to the diode allows an advantage in of being able to change from one direction to the other, allowing more freedom in designs using diodes.

Figure 4:
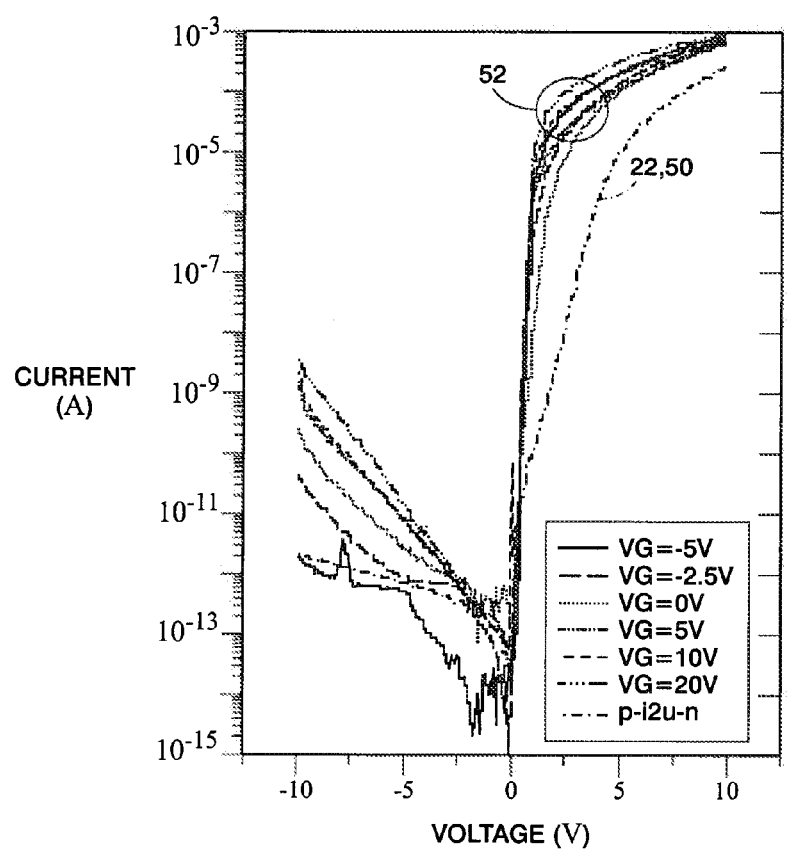
FIG. 4 shows a current-voltage curve for varying PIN diode structures.

A major benefit of providing a biased gate, referred to here as 'gated,' lies in the higher performance by the diode. FIG. 4 shows a series of current-voltage (I-V) curves for gated PIN diodes. The lower curve 50 represents a PIN diode having an i-region of 2 micrometers. The remaining curves represent gated PIN diodes having gate voltages varying from 20 volts to −5 volts. These curves all have a much improved turn on characteristic, as shown in region 52 on the curves. This region may be referred to as having a 'sharp turn.' The ideality factor for these diodes is 1.67, which lies in the expected range.

Several advantages exist for this type of diode. These include the sharp turn feature mentioned above, as well as low parasitic capacitance between the cathode and the anode. The pn junction has a very small cross section, allowing the geometrical junction capacitance to be neglected. In addition, the diffusion capacitance is low, since the minority carrier life time of poly-Si thin films is short, because of extensive recombination due to grain boundaries and interfaces.

Figure 5:
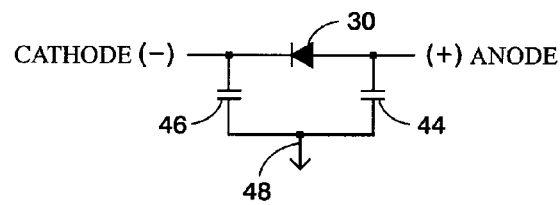
FIG. 5 shows a circuit diagram of a bias circuit for a gated, co-planar PIN diode.

Significant capacitance between either the cathode or anode and the gate exists as a result of the capacitance between the induced channel carrier and the gate, defined by the gate dielectric. FIG. 4 shows these capacitances in a corresponding effective circuit diagram of the diode of FIG. 5. The diode 30 has an anode and a cathode with corresponding effective anode capacitance represented by capacitor 44 and the effective cathode capacitance represented by capacitor 46. However, only one of these capacitances has a non-negligible value at any given time, the one that does depends upon the gate bias polarity. Several circuit applications may use this feature.

Figure 6:
FIG. 6 shows an embodiment of a peak detection circuit using a gated, co-planar PIN diode.

For example, FIG. 6 shows an embodiment of a peak detection circuit using the diode 30. The anode or cathode capacitance conveniently provides the holding capacitance Cc. The device then forms an integrated peak detection circuit. Since only one of the capacitances is non-zero and minimum parasitic capacitance between the anode and cathode exists, the input capacitive loading should remain very low. This enables very high frequency bandwidth.

Figure 7:
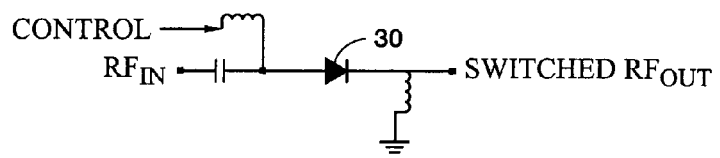
FIG. 7 shows an embodiment of a diode radio frequency switching circuit using a gated, co-planar PIN diode.

Similarly, other high frequency circuits may use PIN diodes as switches, especially when the frequency has a range higher than the comfortable working range for transistors of the same technology. PIN diodes have lower parasitic junction capacitance compared to a PN diode, minimizing the high frequency signal leakage through the parasitic junction capacitance. FIG. 7 shows a diode switching circuit having low parasitic junction capacitance as it employs a gated PIN diode such as 30.

In addition to the low parasitic junction capacitance, the sharper turn on feature discussed above results in lower power consumption to achieve the same resistance value when ON. Large diode switching networks have a known problem with power consumption that using such diodes alleviates.

Figure 8:
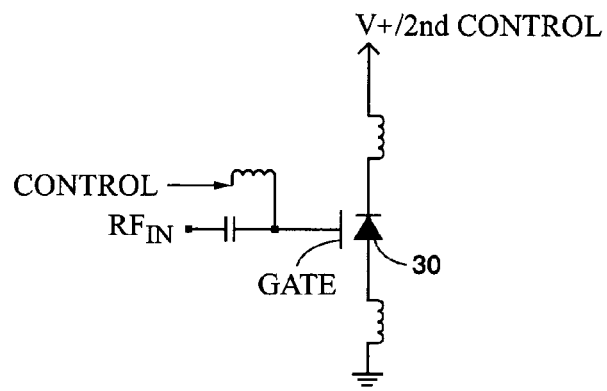
FIG. 8 shows an embodiment of a dual throw diode switch using a gated, co-planar PIN diode.
Figure 9:
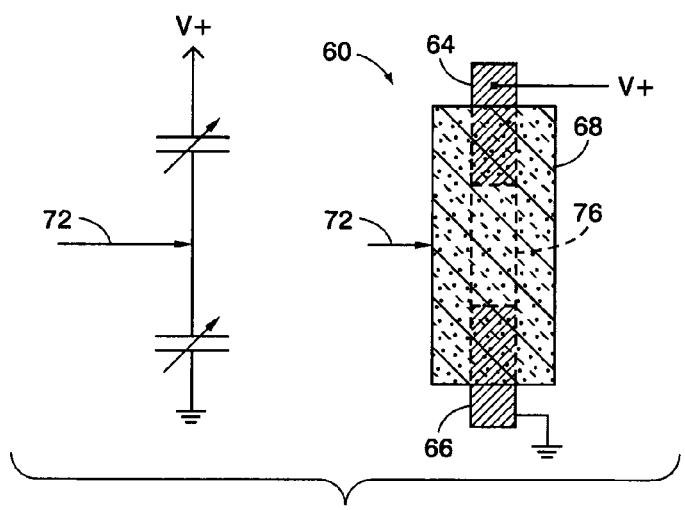
FIG. 9 shows an embodiment of a varactor using a gated, co-planar PIN diode.

Other types of circuits may benefit from the features of the gated PIN diode. FIGS. 8 and 9 show other circuit applications including a dual throw diode switch in FIG. 8. FIG. 9 shows an embodiment of a 'varactor' or variable capacitance diode in both structural and its equivalent circuit forms, wherein a voltage applied to a terminal of the diode controls its capacitance.

The varactor 60 shown in FIG. 9 has a structure similar to that of the diode in FIG. 3, with the p-type region 64 separated from the n-type region 66 and a gate 72 arranged adjacent the i-region. However, the i-region shown here has much larger size than would typically exist in a gated PIN diode of the other embodiments. For that reason, this type of device may be referred to as a 'long channel' PIN diode. In operation, the varactor has three terminals, the gate 72, the cathode 64 and the anode 66. It is a unique device because it can be continuously tuned.

Figure 10:
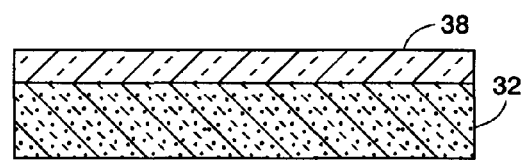
FIGS. 10-15 show a process flow for an embodiment of a method to manufacture gated, co-planar PIN diodes.

Regardless of the length of the i-region, the manufacturing process would remain the same for PIN diodes of the embodiments shown here. FIG. 10 shows an example process for manufacturing PIN diodes. At the top of FIG. 10 a substrate 32 has deposited upon it a layer of material 38. This layer of material will have formed in it the PIN diode. Generally, the layer 38 will consist of an intrinsic semiconductor such as poly-silicon, amorphous silicon, gallium arsenide or silicon on insulator (SOI). Formation of the layer of material may include forming the layer using an excimer laser to anneal a thin film such as a poly-Si thin film. As mentioned before, this layer may have a thickness equal to or less than 100 nanometers.

Figure 11:
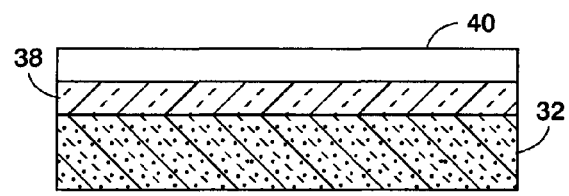
Figure 12:
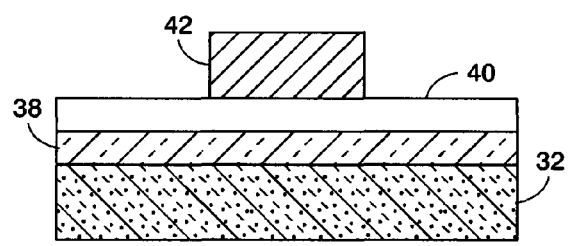

In FIG. 11, the gate dielectric 40 is deposited over the intrinsic semiconductor 38. Gate material 42, typically but not limited to metal, is then deposited on the gate dielectric, as shown in FIG. 12.

Figure 13:
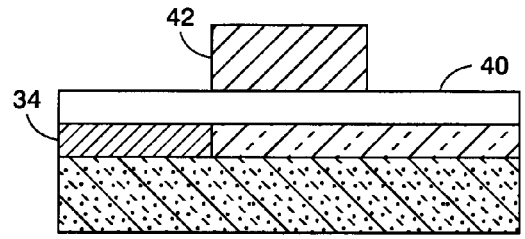
Figure 14:
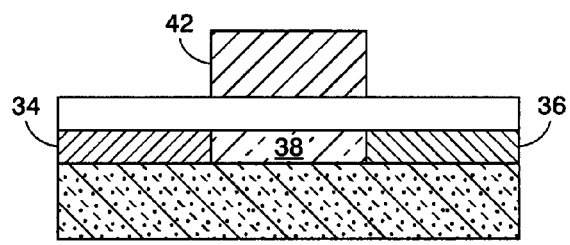

FIG. 13 shows the formation of the p-type region 34 under the gate metal and gate dielectric. This may be done by several methods including implantation. FIG. 14 shows the formation of the n-type region 36. An advantage of forming the n-type and p-type regions after the gate is that the process is 'self-aligning, where the regions line up to the edges of the gate.

Figure 15:
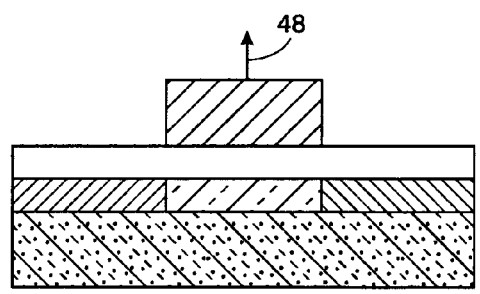

To provide the bias to the gate, the gate receives an electrical connection to a fixed potential 48 shown in FIG. 15. Upon completion of this process, the co-planar, gated diode may be employed in several different circuit applications, as discussed above.

In this manner, a PIN diode having a sharp turn on feature, low parasitic capacitance and generally better performance than other PIN diodes is provided. It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A thin-film diode, comprising:
a first contact of a material having a first conductivity type;
a second contact of a material having a second conductivity type arranged co-planarly with the first contact;
an undoped poly-silicon channel arranged between the first and second contacts resulting in the diode having an anode with capacitance and a cathode with capacitance, wherein only one of the anode capacitance and the cathode capacitance is non-zero at a given time;
a metal gate arranged adjacent the channel such that the gate avoids overlapping the first and second contacts; and
a voltage source electrically connected to the gate, the voltage source being operable either positively or negatively, wherein a polarity of the voltage source determines a gate bias polarity, the gate bias polarity determining which of the anode capacitance or the cathode capacitance is non-zero at the given time.

2. The diode of claim 1, wherein the material having a first conductivity type comprises one of either n-doped poly-silicon, p-doped polysilicon or amorphous silicon.

3. The diode of claim 1, wherein the first and second contacts and the channel comprise one layer of either poly-silicon or amorphous silicon having selectively doped regions.

4. The diode of claim 1, the diode being arranged to operate as a peak detection circuit wherein a voltage input signal is electrically connected to one of either an anode or a cathode of the diode and the gate is biased to one of either positive or negative voltage such that only one of either the cathode or anode has non-negligible capacitance to the gate allowing the capacitance of the gate one of either the cathode or anode to be used as part of the storage capacitor of the peak detection circuit.

5. The diode of claim 1, the diode being arranged to operate as a radio frequency switch, wherein a radio frequency signal and a control signal are connected to an anode of the diode resulting in a switched radio frequency signal output.

6. The diode of claim 1, the diode being arranged to operate as a dual throw diode switch, wherein a radio frequency signal and a control signal are connected to a gate of the diode, an anode of the diode is connected to ground and a cathode of the diode is connected to a voltage source.

7. The diode of claim 1, the diode being arranged to operate as a varactor, the varactor having three terminals comprising a gate, an anode and a cathode, and wherein the varactor is arranged to be continuously tunable.

8. A thin-film diode, comprising:
 a layer of polysilicon material arranged on a substrate;
 a first region of material doped to have a first conductivity type;
 a second region of material doped to have a second conductivity type;
 a channel between the first and second regions formed of an undoped region resulting in the diode having an anode with capacitance and a cathode with capacitance, wherein only one of the anode capacitance and the cathode capacitance is non-zero at a given time;
 a metal gate arranged adjacent the channel such that the gate does not overlap the first and second regions; and
 a voltage source electrically connected to the gate, the voltage source being operable with either positive or negative polarities, wherein the polarity of the voltage source determines gate bias polarity, where the gate bias polarity determines which of the anode capacitance and the cathode capacitance is non-zero at the given time.

9. The diode of claim 8, wherein the layer of material comprises a film of annealed poly-silicon.

* * * * *